US010929194B2

(12) United States Patent
Li et al.

(10) Patent No.: US 10,929,194 B2
(45) Date of Patent: Feb. 23, 2021

(54) WORKLOAD PARTITIONING PROCEDURE FOR NULL MESSAGE-BASED PDES

(71) Applicant: International Business Machines Corporation, Armonk, NY (US)

(72) Inventors: Cheng-Hong Li, New York, NY (US); Alfred J. Park, Oak Ridge, TN (US); Eugen Schenfeld, South Brunswick, NJ (US)

(73) Assignee: International Business Machines Corporation, Armonk, NY (US)

( * ) Notice: Subject to any disclaimer, the term of this patent is extended or adjusted under 35 U.S.C. 154(b) by 1322 days.

(21) Appl. No.: 14/970,793

(22) Filed: Dec. 16, 2015

(65) Prior Publication Data
US 2016/0110226 A1    Apr. 21, 2016

Related U.S. Application Data

(62) Division of application No. 13/107,110, filed on May 13, 2011, now Pat. No. 9,798,587.

(51) Int. Cl.
*G06F 9/50* (2006.01)
*G06F 30/33* (2020.01)
*G06F 9/455* (2018.01)

(52) U.S. Cl.
CPC ............ *G06F 9/5077* (2013.01); *G06F 30/33* (2020.01); *G06F 9/45558* (2013.01); *G06F 2009/45595* (2013.01)

(58) Field of Classification Search
None
See application file for complete search history.

(56) References Cited

U.S. PATENT DOCUMENTS

| 5,832,272 A | 11/1998 | Kalantery |
| 2004/0194048 A1 | 9/2004 | Arnold |
| 2006/0253471 A1 | 11/2006 | Wasserman et al. |
| 2006/0253473 A1 | 11/2006 | Agrawal et al. |

(Continued)

OTHER PUBLICATIONS

Boukerche, Azzedine, and Sajal K. Das. "Reducing null messages overhead through load balancing in conservative distributed simulation systems." Journal of Parallel and Distributed Computing 64, No. 3 (2004): 330-344 (Year: 2004).*

(Continued)

*Primary Examiner* — Omar F Fernandez Rivas
*Assistant Examiner* — Robert S Brock
(74) *Attorney, Agent, or Firm* — Yee & Associates, P.C.

(57) ABSTRACT

An embodiment of the invention includes applying a first partition to a plurality of LPs, wherein a particular LP is assigned to a first set of LPs. A second partition is applied to the LPs, wherein the particular LP is assigned to an LP set different from the first set. For both the first and second partitions, lookahead values and transit times are determined for each of the LPs and related links. For the first partition, a first system progression rate is computed using a specified function with the lookahead values and transit times determined for the first partition. For the second partition, a second system progression rate is computed using the specified function with the lookahead values and transit times determined for the second partition. The first and second system progression rates are compared to determine which is the lowest.

3 Claims, 5 Drawing Sheets

(56) References Cited

U.S. PATENT DOCUMENTS

| | | |
|---|---|---|
| 2009/0276787 A1 | 11/2009 | Banks et al. |
| 2009/0213614 A1 | 12/2009 | Andrade et al. |
| 2010/0011339 A1 | 1/2010 | Eichenberger et al. |
| 2012/0290283 A1 | 11/2012 | Li et al. |

OTHER PUBLICATIONS

El-Khatib, Khalil, and Carl Tropper. "On metrics for the dynamic load balancing of optimistic simulations." In Systems Sciences, 1999. HICSS-32. Proceedings of the 32nd Annual Hawaii International Conference on, 13 pages. IEEE, 1999 (Year: 1999).*

Lim, Chu-Cheow, Yoke-Hean Low, Boon-Ping Gan, Sanjay Jain, Wentong Cai, Wen Jing Hsu, and Shell Ying Huang. "Performance prediction tools for parallel discrete-event simulation." In Parallel and Distributed Simulation, 1999. Proceedings. Thirteenth Workshop on, pp. 148-155. IEEE, 1999 (Year: 1999).*

Johnson, David S., Cecilia R. Aragon, Lyle A. McGeoch, and Catherine Schevon. "Optimization by simulated annealing: An experimental evaluation; part I, graph partitioning." Operations research 37, No. 6 (1989): 865-892. (Year: 1989).*

Pothen, Alex. "Graph partitioning algorithms with applications to scientific computing." in Parallel Numerical Algorithms, pp. 323-368. Springer, Dordrecht, 1997 (Year: 1997).*

Office Action, dated Dec. 29, 2016, regarding U.S. Appl. No. 13/107,110, 39 pages.

Notice of Allowance, dated Jun. 16, 2017, regarding U.S. Appl. No. 13/107,110, 9 pages.

Chandy et al., "Distributed Simulation: A Case Study in Design and Verification of Distributed Programs", IEEE Transactions on Software Engineering, vol. SE-5, No. 5, Sep. 1979, 13 pages.

Perumalla, "Parallel and Distributed Simulation: traditional Techniques and Recent Advances", Proceedings of the 2006 Winter Simulation Conference, © 2006, 11 pages.

Boukerche, "An Adaptive Partitioning Algorithm for Distributed Discrete Event Simulation Systems," Journal of Parallel and Distributed Computing 62, 2002, pp. 1454-1475.

Boukerche et al., "A Static Partitioning and Mapping Algorithm for Conservative Parallel Simulations", Workshop on Principles of Advanced and Distributed Simulation, Jun. 1997, pp. 164-172.

Boukerche et al., "Dynamic Load Balancing Strategies for Conservative Parallel Simulations", Workshop on Principles of Advanced and Distributed Simulation,Jun. 1997, pp. 20-28.

Chiola et al., "Distributed Simulation of Timed Petri Nets: Exploiting the Net Structure to Obtain Efficiency", Application and Theory of Petri Nets, vol. 691 of Lecture Notes in Computer Science, pp. 146-165, Springer 1993.

Cong et al., "Performance Driven Multi-level and Multiway Partitioning with Retiming", Proceedings of the Design Automation Conference, Jun. 2000, pp. 274-279.

Dasdan et al., "Faster Maximum and Minimum Mean Cycle Algorithms for System-Performance Analysis", IEEE Transactions on Computer-Aided Design of Integrated Circuits and Systems, vol. 17, No. 10, Oct. 1998, pp. 889-900.

Fiduccia et al., "A Linear-Time Heuristic for Improving Network Partitions", 1982, IEEE, pp. 1-7.

Fujimoto, "Performance Measurements of Distributed Simulation Strategies," University of Utah, Technical Report No. UUCS-87-026, 1987, pp. 1-28.

Gan et al., "Load Balancing for Conservative Simulation on Shared Memory Multiprocessor Systems", Workshop on Principles of Advanced and Distributed Simulation, May 2000, pp. 139-146.

Gedik et al., "SPADE: the System S Declarative Stream Processing Engine", Proceedings of the AC< SIGMOD International Conference on Management of Data, Jun. 2008, pp. 1123-1134.

Hurford, "Accelerating Conservative Parallel Simulation of VHDL Circuits," Thesis, Air Force Institute of Technology, Dec. 1994, 96 pages.

Kapp et al., "An Improved Cost Function for Static Partitioning of Parallel Circuit Simulations Using a Conservative Synchronization Protocol", Workshop on Principles of Advanced and Distributed Simulation, Jun. 1995, pp. 78-85.

Karypis et al., "Multilevel Hypergraph Partitioning: Applications in VLSI Domain", IEEE Transactions on Very Large Scale Integration (VLSI) Systems, vol. 7, No. 1, Mar. 1999, pp. 69-80.

Kernighan et al., "An Efficient Heuristic Procedure for Partitioning Graphs", Sep. 1969, pp. 1-17, retrieved Apr. 26, 2011. htttp://www.cs.princeton.edu/~bwk/btl.mirror/new/partitioning.pdf.

Konas et al., "Partitioning for Synchronous Parallel Simulation", Workshop on Principles of Advanced and Distributed Simulation, 1995, pp. 181-184.

Korniss et al., "Statistical Properties of the Simulated Time Horizon in Conservative Parallel Discrete-Event Simulations," Proceedings of the 2002 ACM Symposium on Applied Computing (SAC '02), Mar. 2002, pp. 132-138.

Leiserson et al., "Retiming Synchronous Circuitry", Aogorithmica, 6: 5-35, Jun. 1991.

Lemeire et al., "Lookahead Accumulation in Conservative Parallel Discrete Event Simulation," Proceedings 18th European Simulation Multiconference, Jan. 2004, 6 pages.

Li et al., "Analytical Performance Modeling for Null Message-Based Parallel Discrete Event Simulation," 19th Annual IEEE International Symposium on Modelling, Analysis, and Simulation of Computer and Telecommunication Systems, Jul. 2011, pp. 349-358.

Lin et al., "Asynchronous Parallel Discrete Event Simulation," IEEE Transactions on Systems, Man, and Cybernetics—Part A: Systems and Humans, vol. 26, No. 4, Jul. 1996, pp. 397-412.

Liu et al., "Data Flow Partitioning with Clock Period and Latency Constraints", IEEE Transactions on Circuits and Systems I: Fundamental Theory and Applications, Mar. 1997, 44(3):210-220.

Nicol, "The Cost of Conservative Synchronization in Parallel Discrete Event Simulations," Journal of the Association for Computing Machinery, vol. 4, No. 2, Apr. 1993, pp. 304-333.

Park et al., "Conservative Synchronization of Large-Scale Network Simulations," Proceedings of the 18th Workshop on Parallel and Distributed Simulation (PADS '04), May 2004, 9 pages.

Su et al., "Variants of the Chandy-Misra-Bryant Distributed Discrete-Event Simulation Algorithm," Caltech Computer Science Technical Report, Dec. 1988, 16 pages.

Varga et al., A Practical Efficiency Criterion for the Null Message Algorithm, European Simulation Symposium, Oct. 2003, pp. 1-12.

* cited by examiner

WORKLOAD PARTITIONING PROCEDURE FOR NULL MESSAGE-BASED PDES

CROSS-REFERENCE TO RELATED APPLICATION(S)

This application is a division of and claims the benefit of priority to U.S. patent application Ser. No. 13/107,110, filed May 13, 2011, and entitled "Workload Partitioning Procedure For Null Message-Based PDES", the contents of which are incorporated herein by reference.

BACKGROUND OF THE INVENTION

1. Field of the Invention

The invention disclosed and claimed herein generally pertains to a method for partitioning the simulation processes of a null message-based parallel and distributed discrete event simulation (PDES). More particularly, the invention pertains to a method of the above type wherein the workload comprises a number of logical processes (LPs), and a metric related to progression rate or simulation speed is used to select a particular partitioning, which is applied to the LPs to enhance overall simulation performance.

2. Description of the Related Art

As is known by those of skill in the art, discrete event simulation is used to represent the operation of a physical system as a chronological sequence of events. Physical processes of the system are simulated by one or more logical processes (LPs), which may each comprise a sequential discrete event simulation program. A discrete event simulation can be viewed as a sequence of event computations, wherein each computed event has a time stamp indicating when that event occurs in the physical system. The collective simulations of one or more LPs comprise a simulation workload. As used herein, "virtual time" is the time of an event or physical process in the physical system. "Run time" is the amount of time an LP uses to simulate a physical process.

In parallel and distributed discrete event simulation (PDES), multiple LPs of the above type are provided, and different LPs are respectively executed on two or more data processors or computing devices. PDES is used to model the behavior of physical systems in application fields such as telecommunication networks, digital logic circuits and transportation, by way of example. In PDES, each LP in a group of LPs may be connected over links or channels to each of the other LPs. The LPs communicate with each other by sending time-stamped events to one another over the links or channels. An LP may thus receive time-stamped events from two or more of such LPs. However, it is very important for each LP to always process events in time-stamp order. Because of this requirement, a condition known as deadlock can occur, which is discussed hereinafter in further detail. To avoid deadlock in PDES, a procedure for transmitting null messages may be used, as likewise discussed hereinafter.

As is further well known by those of skill in the art, a simulation workload in PDES can be partitioned, in an effort to maximize simulation performance. In PDES, partitioning is carried out by assigning each LP in a plurality of LPs, which collectively perform the simulation, to one of a plurality of sets or groups. Each set corresponds to a different one of a plurality of computing devices, and each LP of a set is intended for execution by the computing device corresponding to that set. The LPs of different sets can thus be executed simultaneously, or in parallel.

In order to maximize simulation performance gain, the partitioning effort should minimize the impact of inter-LP communication delays and balance the computing resource requirement in each set of LPs. Yet these two goals are sometimes conflicting. Further, it is often the case that not all of the inter-LP communication delays can be minimized. Therefore the partitioning effort should identify and prioritize the most critical LPs in terms of simulation performance. However, due to the lack of an accurate and quantitative performance model, currently available solutions to simulation workload partitioning suffer certain drawbacks, when they are applied to null-message based PDES. For example, existing partitioning approaches typically cannot identify the most critical task LPs, and are not able to quantitatively evaluate their impact on the simulation performance. In addition, existing partitioners used by these simulation partitioning approaches only measure the impact of the communication traffic, but not the overall simulation performance. For example, one solution uses rule of thumb to identify LPs which might be the critical task LPs, and then uses a pre-processing step to force the partitioner to assign all of these critical task LPs to the same computing device. However, the partitioning goals of balancing computation and prioritizing critical LPs may conflict with each other. Without a quantitative measure, it can be very difficult to achieve an optimal partitioning result.

SUMMARY OF THE INVENTION

Embodiments of the invention present a generic partitioning approach, which uses an accurate performance evaluation model in its decision making process for PDES based on null message algorithms. By using this performance evaluation method, exact critical simulation tasks can be identified efficiently and prioritized accordingly in the partitioning process. Further, the performance evaluation method also gives the partitioner a system-level view of the impact of its decision process by enabling accurate evaluation of the partitioning quality in terms of the simulation performance.

An embodiment of the invention directed to a method is associated with a plurality of LPs comprising a simulation workload, wherein each LP is configured to simulate a specified physical process, the simulation workload requires implementation of one or more cycles, and each cycle is implemented by two or more specified LPs which are connected to one another by specified links. The method includes the step of applying a first partition to the plurality of LPs, wherein each LP is assigned to one of a plurality of sets for execution by a corresponding one of a plurality of computing devices, and a particular LP is assigned to a first set. The method further includes applying a second partition to the plurality of LPs, wherein the particular LP is assigned to a second set for execution that is different from the first set. The method includes determining, for both the first and second partitions, respective lookahead values and transit times for the specified LPs and specified links. For the first partition, a first system progression rate is computed, using a specified function of the lookahead values and transit times determined for the first partition. For the second partition, a second system progression rate is computed, using the specified function with the lookahead values and transit times determined for the second partition. The first and second system progression rates are selectively compared, in order to determine which of the compared system progression rates is the lowest.

DETAILED DESCRIPTION OF THE PREFERRED EMBODIMENT

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In embodiments of the invention, a very useful metric is provided for measuring or representing the speed of a PDES workload simulation that uses null messages. This metric is based on the latencies or time delays between the software processes of respective LPs, and also on communication delays there between. A partitioning algorithm or procedure is also provided, which optimizes the metric and thereby optimizes performance of the PDES simulation.

Figure 1:
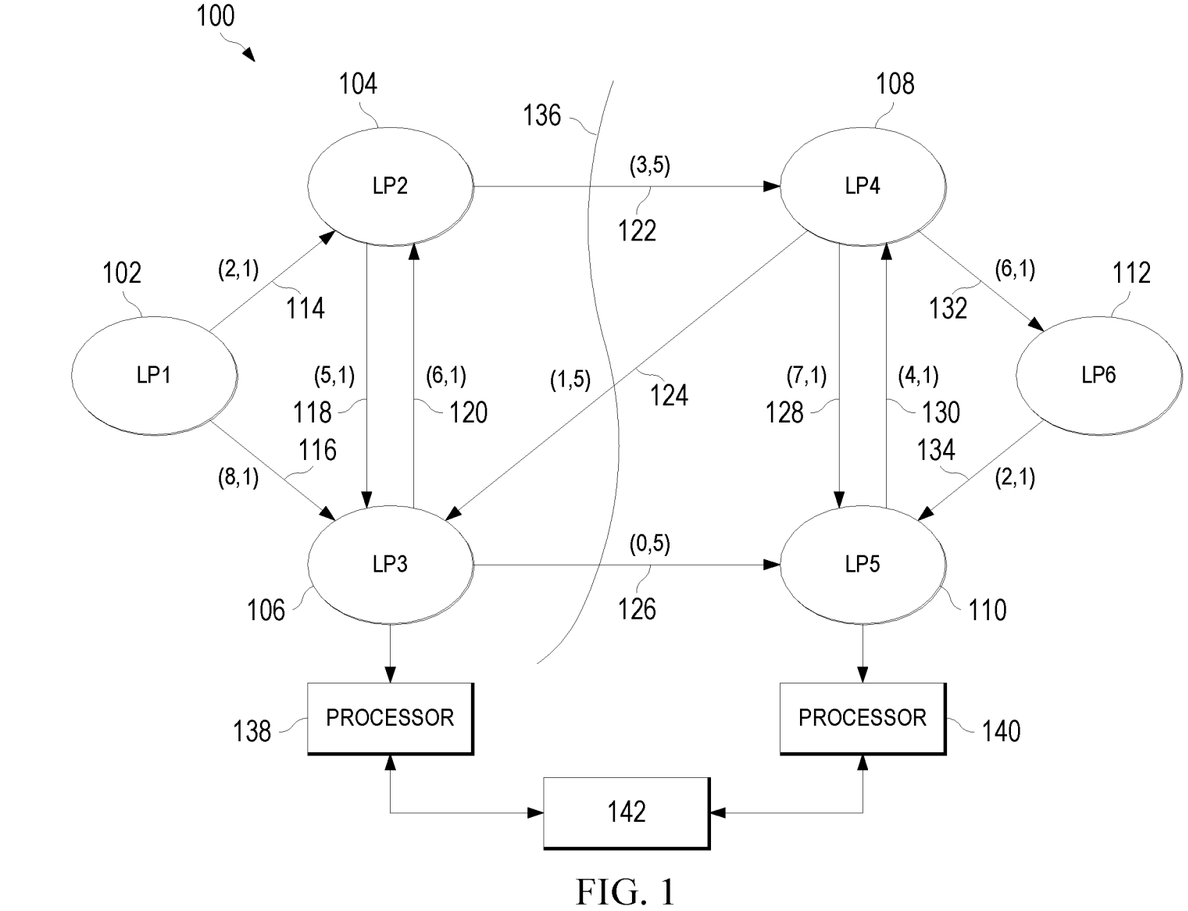
FIG. 1 is a schematic drawing depicting a first LP graph pertaining to an embodiment of the invention.

Referring to FIG. 1, there is shown graph 100 of LPs, which is useful for modeling the simulation and illustrating the metric that are referred to above. Graph 100 depicts nodes 102-112, which are also referenced as LP1-LP6, respectively. Each of the nodes comprises a software logical process or LP, which collectively carry out the simulation.

FIG. 1 further shows links or edges 114-134, each extending between a pair of LP nodes. Each link represents a communication channel, for transmitting messages from one node of a pair to the other, and also shows the direction of transmission. Links 114-134 thus indicate communication relationships among respective nodes. Each of the communications is by means of discrete time-stamped messages, called simulation events. Communication of the LPs is conducted either through shared memory space or remote message passing, or a combination of both. In these illustrative examples, an LP link is an example of one embodiment of links 114-134.

FIG. 1 also shows certain LPs grouped into cyclic structures with other LPs. Each of these structures operates in a cycle and each LP of the structure progresses at the same rate. In the LP graph of FIG. 1, each cycle is defined by a closed loop of directed links or edges that are all oriented in the same direction, either clockwise or counter clockwise around the loop. Thus, one cycle of graph 100 comprises LP2-LP4-LP3. Other cycles would include LP2-LP3; LP4-LP5; LP3-LP5-LP4; and LP4-LP6-LP5.

Referring further to FIG. 1, there is shown a partition 136, for illustrating a partitioning of the LP group of LP1-LP6. There are also shown computing devices or data processors 138 and 140. As described above and as also well known by those of skill in the art, when a partition is applied to multiple LPs of a PDES arrangement, different LPs are placed into sets and assigned to different processors. In one example, the sets of the different LPs may include one or more subgroups of different LPs. The processors can then execute their respective LPs simultaneously with one another, or in parallel relationship. This practice can significantly reduce the overall time required to process the entire simulation workload. FIG. 1 further shows each of the processors 138 and 140 controlled by a computer or data processing system 142, which is configured for use in carrying out embodiments of the invention as described herein.

As an illustration of partitioning in PDES, FIG. 1 shows that the partition 136 results in LP1-LP3 being placed in a set assigned to processor 138 for processing. LP4-LP6 are placed in a different set, and assigned to processor 140.

It is essential in PDES parallel processing that each simulation event, or discrete time-stamped message received by an LP, is processed by the LP in time-stamped order. As shown for example by FIG. 1, an LP can receive time-stamp messages from two or more other LPs. To handle this situation, each LP has a logical queue for each LP from which it can receive messages. Event messages received from different LPs are respectively placed into their corresponding queues at the receiving LP.

A receiving LPi uses a simple rule to select messages from its logical queues for processing. When each of its logical queues has at least one message, the largest time stamp of the messages in each logical queue, called channel virtual time, is compared. The smallest channel virtual time is selected, and is called the local virtual time of LPi. Across all logical queues, messages whose time stamp is no greater than the local virtual time are deemed safe. LPi uses the set or a non-empty subset of these safe events to simulate the physical process. The simulation of the physical process may result in new events, which will be sent to the downstream LPs of LPi. This process, consisting of waiting for logical queues to be non-empty, computing the local virtual time from the time stamps of received events, identifying safe events based on the local virtual time, simulating the physical process with the set or a non-empty subset of the safe events, and sending the new events to downstream LPs, is called an iteration of the null message algorithm. Each LP repeats this process (iteration) until its local virtual time reaches a predetermined simulation end time. After all LPs reach the end time, the simulation finishes.

In the above PDES arrangement, a problem could occur, if all the event messages received by an LP from a particular sending LP were processed by the receiving LP, before the receiving LP received any further messages from the particular sending LP. In this situation, the queue for the particular LP would become empty, and the receiving LP could not process event messages from other LPs. If the receiving LP was to do so, it might receive an event message from the particular LP that was time-stamped earlier than an event received from another LP, which the receiving LP had just processed. In view of this situation, the receiving LP generally must wait until it receives a new message from the particular LP, before processing any further messages. However, it could happen that a number of LPs, which were interconnected to send event messages to one another, all experienced this situation at the same time. If this occurred, a PDES configuration involving these LPs could encounter deadlock.

In order to overcome a deadlock condition in PDES, a null message technique is usefully employed. In accordance with this technique, a time period T' is selected for an LPi which sends time-stamped messages to LPj. Due to the nature of the physical processes that LPi and LPj respectively simulate, LPi might not send a message to LPj for a time period T'. Whenever this happens, LPi sends a null message to LPj, wherein the null message contains no information, other than a time-stamp.

The time-stamp represents the time at which the null message is sent from LPi, with a lookahead time added to it. Upon receiving the null message, LPj is assured that all events which have a time-stamp less than the null message are safe to process. Usefully, if LPi simulates a physical process PPi and LPj simulates a physical process PPj, lookahead time $L_{ij}$ for a (null) message traveling from LPi to LPj is selected to be the minimum delay, in virtual time that could occur for an event or event message traveling from PPi to PPj.

Referring further to graph 100 of FIG. 1, it is assumed that the LPs thereof are in strongly connected components. A strongly connected component of LPs is defined as a maximal set of LPs any of which is connected to any other LP in the same set. Also, as described above, graph 100 comprises a number of cyclic structures, wherein all LPs of a structure progress at the same rate asymptotically. For these conditions, $P_i = P_j$ (asymptotically), where $P_i$ and $P_j$ are the progression rates of LPi and LPj, respectively. The progression rate of an LP in PDES is a measure of how much run time an LP needs to simulate the operation of the corresponding physical process during a given amount of virtual time, that is, an amount of time of actual operation of the physical process. Similarly, the system progression rate of the simulator is a measure of how much run time the simulator needs to simulate the operation of the entire physical system during a given amount of virtual time, and may be defined as the ratio of an amount of virtual time to the corresponding amount of simulator run time. Since all LPs in a cyclic structure (or a strongly connected component) have the same asymptotic progression rate, the system progression rate is the progression rate of any LP.

In accordance with embodiments of the invention, it has been recognized that the system progression rate may serve as a very useful metric for assessing the overall simulation performance of a null-message based PDES simulator. It has been recognized further that the system progression rate may also be used to measure the effects of different partitionings, which may alternatively be applied to the LPs of a given workload simulation.

In order to derive an expression for the system progression rate, for a simulator comprising a plurality of LPs such as LP1-LP6 of FIG. 1, it is first assumed that the workload simulation will include a number of cycles, which are shown by the associated LP graph. For a given cycle and a given partitioning of the plurality of LPs, there will be lookahead values Lij as previously described, wherein Lij is the lookahead value for null messages traveling through a link or channel (i, j) from LPi to LPj. Each lookahead value Lij may be determined by measurements or other analysis of components of the physical system that corresponds to the simulation.

As further elements for deriving the system progression rate, the value $\tau_i$ is defined to be the lower bound of the run time needed by LPi to simulate a physical process PPi for one iteration of the null message algorithm. Also for a given partitioning, $\pi_{ij}$ is defined to be the shortest delay that a message can experience, in traveling through link (i, j) from LPi to LPj. Usefully, $d_{ij}$ is defined to be $d_{ij}=\tau_i+\pi_{ij}$, and $d_C$ for a given cycle is defined to be $d_C=\Sigma_{e \in C}d_e$. Thus, for each cycle C of a simulator, as shown by an LP graph, $d_C$ is the sum of all the $d_{ij}$ values of all the LPs included in that cycle, and of all the links or channels between such LPs. Also, $L_C$ for each cycle C is defined to be $Lc=\Sigma_{e \in C}L_e$, that is, the sum of all Lij values of the LP graph for that cycle. For each cycle C, the ratio between Lc and $d_C$, (Lc/$d_C$) is called the LD ratio.

For the above relationships, the system progression rate P, for a simulation workload which is represented by an LP Graph, is as follows:

$$P \leq \min_{C \in G} \frac{L_C}{d_C} \quad \text{Equation (1)}$$

It is seen from Equation (1) that the system progression rate P is upper-bounded by the LD ratios of the cycles in G. The cycle with the lowest LD ratio determines the (upper bound of) system progression rate, and is the critical cycle of the simulation. In order to evaluate the lowest value of the LD ratios using an LP graph, each edge or link (i, j) of the graph is assigned two weights, namely, an Lij value and a dij value. For example, link 114 of FIG. 1, between LP1 and LP2, shows a first weight value of 2, and a second weight value of 1. Link 116 shows a first weight value of 8 and a second weight value of 1. The first weight value Lij comprising lookahead as described above, represents a cost in virtual time, that is, an amount of time which is actually taken by a physical process. The second weight dij comprises transit time.

By providing respective weights for each cycle, as shown by the LP graph of FIG. 1, Equation (1) can be used to determine the LD ratio for the critical cycle of the simulator. Each of the Lij values for a cycle may be determined from the simulator model which was constructed to provide respective LPs for each process of the physical system. Each of the transit times dij values may be determined by measurement or other analysis of simulator operation.

In order to select a partition that will enhance simulation performance, the LPs of a simulator are initially partitioned into two sets, with the LPs of each set being assigned to different processes. This is illustrated, for example, by partition 136 of FIG. 1, as described above. This initial partitioning may be made randomly, or on some other basis. After partitioning, the LD ratios are computed using Equation (1), for each cycle of the initial partition, to determine the system progression rate P.

Referring again to FIG. 1, the LD ratios are computed for each of the cycles of graph 100. It is then determined that the cycle LP3-LP5-LP4 has the lowest value of the LD ratios. For this cycle, $L_C$=(0+4+1)=5, and $d_C$=(5+1+5)=11. Accordingly, the LD ratio is 5/11 for this cycle. For cycle LP2-LP4-LP3, the LD ratio would be (5+3+1)/(5+1+5), or 8/11, which is greater than 5/11. FIG. 1 further discloses that transit times du are greater for links that cross the partition than for links that do not.

After initially partitioning the LP graph as shown by FIG. 1, a new partition is applied thereto. This is carried out by selecting at least one LP from each set of the initially partitioned LP. Each of the selected LPs is then switched from its initial set to the other set. In other embodiments, different numbers of LPs may be switched from one set to the other, including only switching a single LP from one set to the other.

Figure 2:
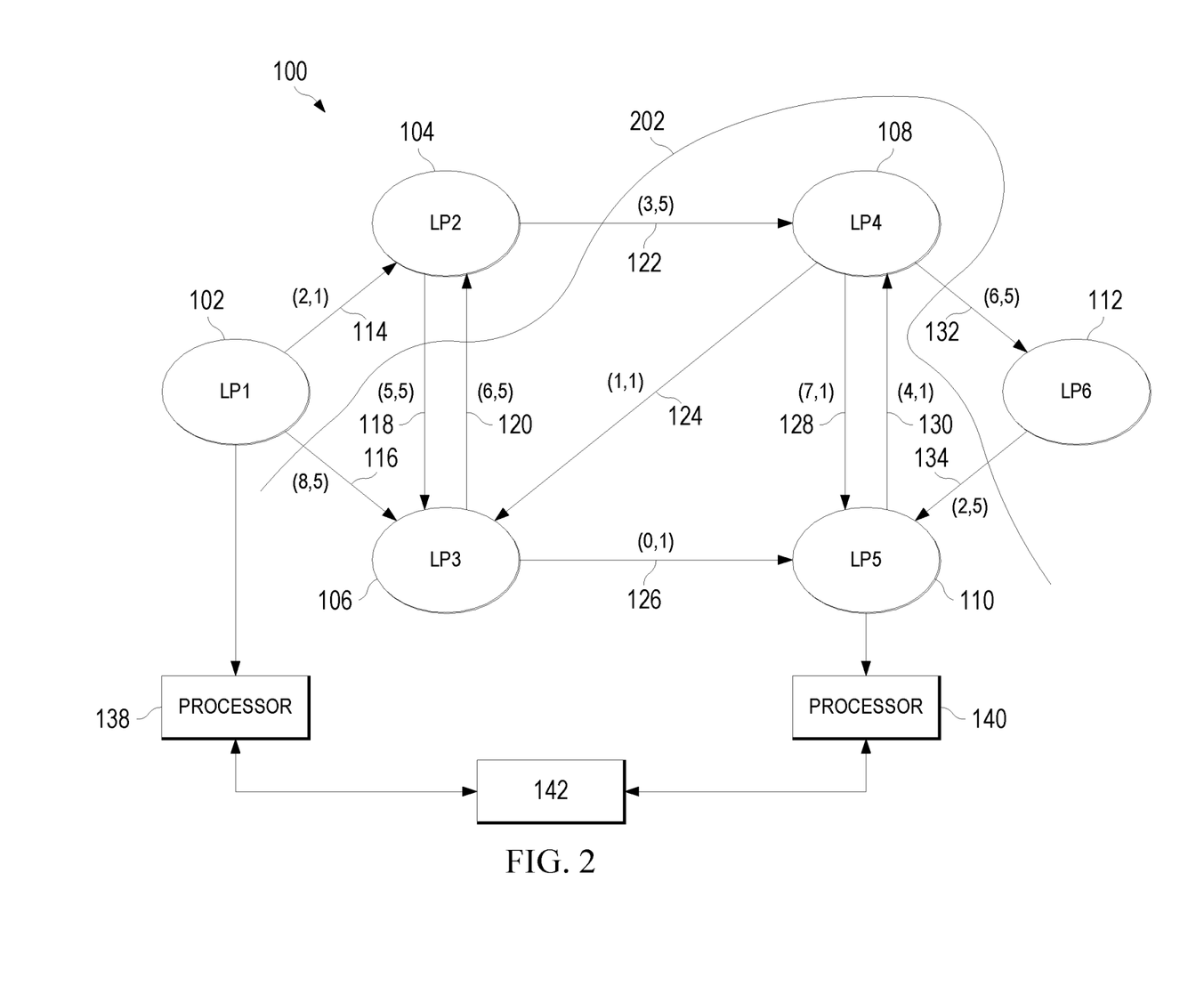
FIG. 2 is a schematic diagram depicting a second LP graph pertaining to the embodiment of FIG. 1.

FIG. 2 illustrates this second partitioning of graph 100. More particularly, FIG. 2 shows graph 100 partitioned by means of partition 202, rather than the partition 136 of FIG. 1. Partition 202 effectively switches LP6 into the same set as LP1 and LP2, and switches LP3 into the same set as LP4 and LP5. Accordingly, LP1, LP2, and LP6 are each assigned to processor 138 for processing, and LP3, LP4, and LP5 are assigned to processor 140.

After the second partition has been applied to the LPs of graph 100, the weighting values are determined for respective links or edges (i, j). These values are then used with Equation (1) to determine the system progression rate, which is the lowest LD ratio for respective cycles of the newly partitioned graph. For the weighting values shown by FIG. 2, the cycle LP2-LP4-LP3 has the lowest value of the LD ratios, and is thus the critical cycle for this partitioning. Therefore the system progression rate, for the graph of FIG. 2, is 10/11.

After determining the system progression rate for the second partition as shown by FIG. 2, such value is compared with the system progression rate determined for the first partition shown by FIG. 1. A criterion is then applied to the result of this comparison. For example, the system progression rate P for the partition of FIG. 2, which was 10/11, is significantly greater than 5/11, which was the value of the system progression rate of P for the partition of FIG. 1. Since the system progression rate represents simulation speed, improved performance is indicated by the higher system progression rate resulting from the partitioning of FIG. 2. Alternatively, an iterative process could be engaged in, wherein each iteration comprises a partition of the LP graph, and the minimum LD ratio across all cycles for that partition is computed to provide the system progression rate value for that partition. Successive iterations could continue, until the system progression rate value for the most recent partition is found to be greater than the system progression rate value for the next most recent partition or any other partition considered earlier. If not, the iterative process would end. In another approach, the iterative process would continue only if the difference between the compared system progression rate values for the most recent and next most recent partitions (or any partition generated earlier) is greater than a pre-specified amount.

Figure 3:
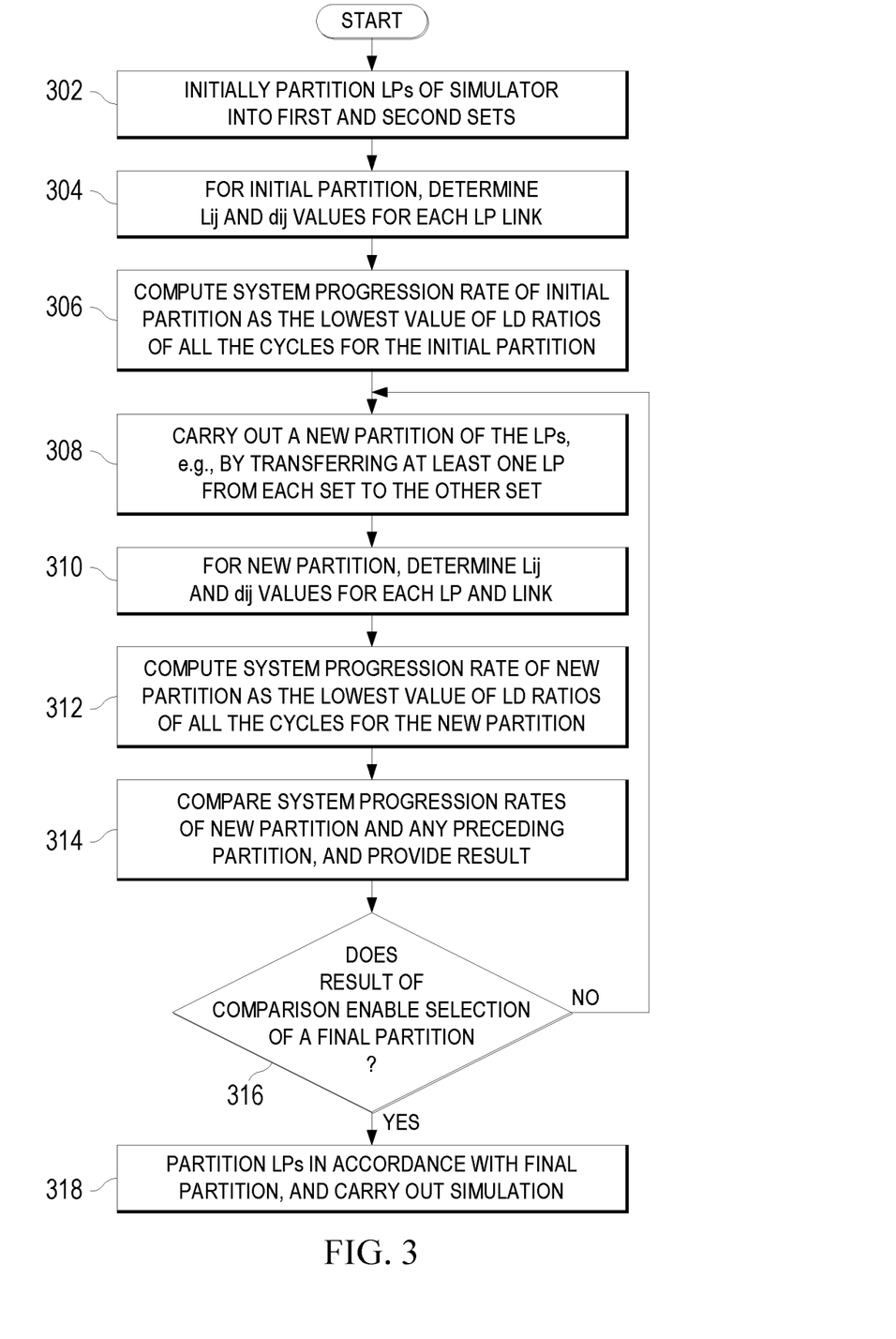
FIG. 3 is a flowchart showing steps for a method comprising an embodiment of the invention.

Referring to FIG. 3, there is shown a flowchart providing steps for a method comprising an embodiment of the invention. At steps 302-306, the LPs of a simulator are initially partitioned into two sets, as described above in connection with FIG. 1. Lij and du values are determined for each LP and link associated with respective cycles of the initial partition. Using these values together with the function specified by Equation (1), the system progression rate is computed for the initial partition.

At steps 308-312, a new partition of the LPs is carried out, such as by exchanging at least one LP in one of the sets with at least one LP in the other set. Pertinent $L_{ij}$ and $d_{ij}$ values and the LD ratios rates for respective cycles are then computed for the new partition, in order to determine the system progression rate thereof. At step 314 the system progression rates of the new and immediately preceding partitions are compared, and a result of the comparison is produced or provided. For a number of embodiments, the result will be the difference between the two system progression rates. The result of step 314 is routed to decision step 316.

At step 316, it is determined whether or not the result enables a final partition to be selected from among the partitions already applied to the LP simulator. The selected final partition would then be used, as shown by step 318, to partition the LP simulator when the simulator is actually used to carry out the workload simulation to simulate the physical process.

Generally, the result from step 314 would be used with a criterion or condition at decision step 316. For example, the criterion could be that if the difference between the respective system progression rates for the newest and any preceding partitions is no greater than a prespecified value, the partition with the highest system progression rate would be selected to be the final partition. The method of FIG. 3 would then proceed to step 318. Otherwise, the method would be directed to repeat steps 308-316. These steps would be iteratively repeated for different partitionings of the LP simulator, until the criterion of step 316 was met or complied with.

Examples of other criteria or conditions, without limitation, could be that the system progression rates for a prespecified number of partitions must be considered, before a final partition could be selected. An alternative criterion could be that successive iterations would continue, as long as the system progression rate for each new partition was greater than the system progression rate of the immediately preceding partition.

For an N-way partitioning of a group of LPs of the simulator, the LPs are initially partitioned into three or more subgroups. Pairs of the subgroups are then iteratively processed, using Equation (1) and the two set partitioning procedure described in connection with FIGS. 1-3.

Figure 4:
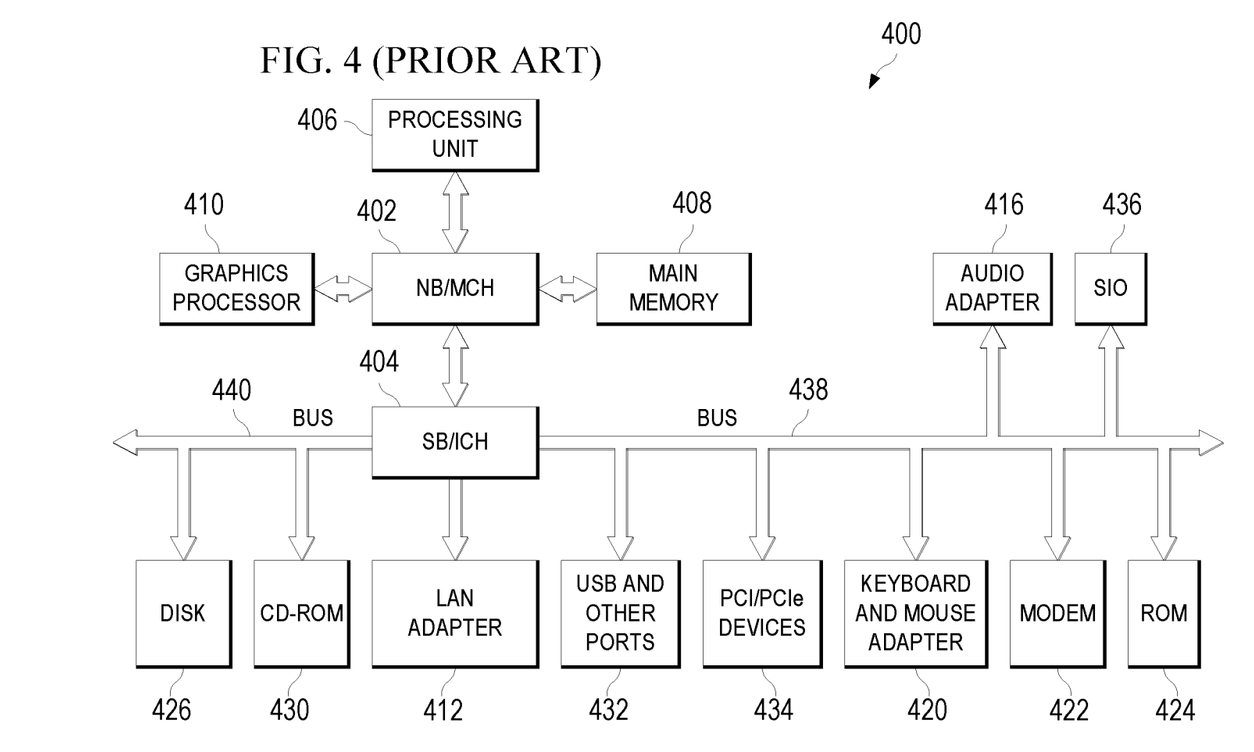
FIG. 4 is a block diagram showing a data processing system which may be used in implementing embodiments of the invention.

Referring to FIG. 4, a block diagram of a computer or data processing system 400 is shown in which aspects of the present invention may be implemented. Data processing system 400 is an example of a computer which may be used as the computer or data processing system 142 of FIG. 1, in which computer usable code or instructions implementing the processes for embodiments of the present invention may be located.

In the depicted example, data processing system 400 employs a hub architecture including north bridge and memory controller hub (NB/MCH) 402 and south bridge and input/output (I/O) controller hub (SB/ICH) 404. Processing unit 406, main memory 408, and graphics processor 410 are connected to NB/MCH 402. Graphics processor 410 may be connected to NB/MCH 402 through an accelerated graphics port (AGP).

In the depicted example, local area network (LAN) adapter 412 connects to SB/ICH 404. Audio adapter 416, keyboard and mouse adapter 420, modem 422, read only memory (ROM) 424, disk 426, CD-ROM drive 430, universal serial bus (USB) ports and other communication ports 432, and PCI/PCIe devices 434 connect to SB/ICH 404 through bus 438 and bus 440. PCI/PCIe devices 434 may include, for example, Ethernet adapters, add-in cards, and PC cards for notebook computers. PCI uses a card bus controller, while PCIe does not. ROM 424 may be, for example, a flash binary input/output system (BIOS).

Disk 426 and CD-ROM drive 430 connect to SB/ICH 404 through bus 440. Disk 426 and CD-ROM drive 430 may use, for example, an integrated drive electronics (IDE) or serial advanced technology attachment (SATA) interface. Super I/O (SIO) device 436 may be connected to SB/ICH 404.

An operating system runs on processing unit 406 and coordinates and provides control of various components within data processing system 400 in FIG. 4. As a client, the operating system may be a commercially available operating system such as Microsoft® Windows® (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 400 (Java is a trademark of Sun Microsystems, Inc. in the United States, other countries, or both).

As a server, data processing system 400 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 400 may be a symmetric multiprocessor (SMP) system including a plurality of processors in processing unit 406. Alternatively, a single processor system may be employed.

Instructions for the operating system, the object-oriented programming system, and applications or programs are located on storage devices, such as disk 426, and may be loaded into main memory 408 for execution by processing unit 406. The processes for embodiments of the present invention are performed by processing unit 406 using computer usable program code, which may be located in a memory such as, for example, main memory 408, ROM 424, or in one or more peripheral devices, such as, for example, disk 426 and CD-ROM drive 430.

In some illustrative examples, data processing system 400 may be a personal digital assistant (PDA), which is configured with flash memory to provide non-volatile memory for storing operating system files and/or user-generated data.

Figure 5:
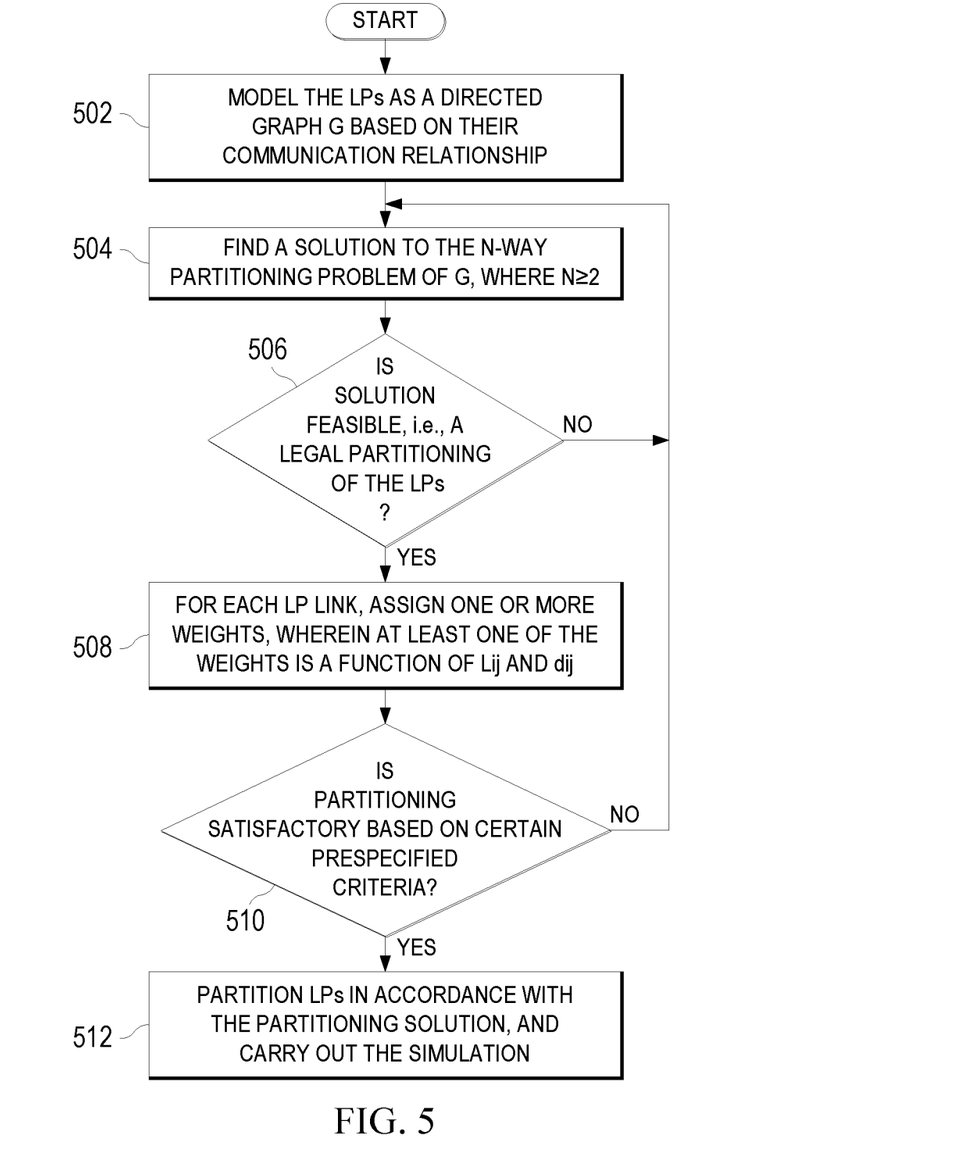
FIG. 5 is a flowchart showing steps for a method comprising a further embodiment of the invention.

Referring to FIG. 5, a flowchart is shown which depicts steps for a method comprising a further embodiment of the invention. At step 502, the LPs are modeled as a directed graph G based on their communication relationship.

At step 504, a solution is found to the N-way partitioning problem of G, where N is equal to or greater than 2. A number of methods or techniques are described hereinafter, for use in finding a solution to the partitioning problem of step 504.

At step 506, it is decided if the solution is feasible (i.e., a legal partitioning of the LPs). If not, the method goes back to step 504 and repeats steps 504 and 506. Otherwise, the method continues to step 508.

At step 508, for each LP link, one or more weights is assigned, at least one of which is a function of lookahead $L_{ij}$ and transit time $du$.

At step 510, it is decided if the partitioning is satisfactory based on certain prespecified criteria, comprising an arbitrary combination selected from at least the following: (1)

the progression rate satisfies a certain predetermined value; (2) the progression rate is maximized across all possible partitionings; (3) other metrics of the partitioning like the number of LP links connecting LPs in two different sets satisfy predetermined values or optimized; (4) the number of partitionings that have been tried so far; (5) and the total elapsed run time of the partitioning. If the partitioning is not satisfactory, the method goes back to repeat steps 504-510. Otherwise, the method continues to step 512.

At step 512, the LPs are partitioned in accordance with the partitioning solution, and the simulation is carried out.

While not explicitly shown in FIG. 5, it could happen that the initial or very first partitioning solution found at step 504 was determined to be acceptable by a user, because it met a prespecified condition or for some other reason. In this event, the steps 504-510 could be comparatively trivial.

If the given LPs do not form a cycle, one or more "conceptual" links can be added between the LPs such that all of the LPs are part of at least one cycle. Such conceptual links are used to capture the flow control mechanism implemented in simulation between LPs. Suppose LPi sends events to LPj, and the size of the logical queue storing events from LPi to j is limited through certain feedback mechanism between LPi to j. As an example, one type of feedback mechanism temporary stops the execution of LPi if the logical queue storing events from LPi to j is full. For such a link from LPi to j, we add a new conceptual link from LPj to LPi (in reverse direction).

These conceptual links will also have assignments of weights as functions of Lij and dij, as normal links do, but their values have different interpretations. Lij of a reverse link is the maximum possible difference between LPi's and j's local virtual times, and dij is the minimum delay which the feedback mechanism needs to take effect.

Depending on how the feedback mechanism is implemented, such reverse links can be added to every communicating pair of LPs, or only to a subset of communicating pairs of LPs. Further, it can also be added as a self-loop of LPs, like "source" LPs (LPs without any inputs, i.e., LPs do not receive any events but only send events). For example, a link (i, i) with assigned Lii and dii weights connecting LPi to i itself can be added to represent a flow-control constraint of LPi: the consecutive executions of LPi must be separated by dii wall-clock time apart and LPi's local virtual time can only advance Lii between any two consecutive executions of LPi. Given the condition that the augmentation of these reverse, logical links between LPs make all LPs part of a cycle, the disclosed partitioning method does not depend on whether the original LPs form cycles.

Various methods can be used to find a partitioning at step 504 of FIG. 5. These methods are detailed below:

1. A random partitioning can be used as a staring point at least in the first iteration of the method. In a random partitioning an LP is randomly assigned to one of the N sets. If a balanced partitioning is required, a set can have at most certain predetermined number of LPs.
2. A partitioning generated by any existing partitioning method can be used in step 504. Such partitioners include (a non-exhaustive list) the so-called min-cut partitioners which minimize the number of LP links connecting LPs assigned to different sets, spectral-method based partitioning algorithms, and simulated-annealing based approaches.
3. If a partitioning already exists, like the one computed from the previous iteration, a new partitioning can be obtained from the existing partitioning by swapping one or more LPs selected from two sets of LPs in the original partitioning.
4. Certain heuristics considering the value of Lij and du can be used. For example, a generic approach would first identify one or more cycles in G which are more likely to violate the desired progression rates than the others, or more likely to become 'critical cycles' in the considered partitioning. Such cycles are prioritized in a way that the number of LPs in these cycles assigned to different sets is minimized.
5. A more expensive approach is to solve a mathematical programming formulation of the partitioning problem either exactly or heuristically. The formulation below is a mixed integer linear program (MILP) for a N-way partitioning of LPs:

Objective: maximize P
Subject to:

$$\forall (i, j) \in G, \quad a_i - a_j + (d_{ij} + s_{ij}\delta_{ij}) \leq L_{ij} \times \frac{1}{P} \quad (1)$$

$$\forall LPi, \sum_{x=1}^{N} b_{ix} = 1 \quad (2)$$

$$\forall x, 1 \leq x \leq N, \sum_{LPi} b_{ix} \leq M \quad (3)$$

$$\forall x, 1 \leq x \leq N, s_{ij} \geq b_{ix} - b_{jx} \quad (4)$$

$$P \geq 0, b_{ix} \in \{0, 1\} \quad (5)$$

P, $a_i$, $s_{ij}$, $b_{ix}$ are variables whose values are to be determined by the MILP solver. The values of $b_{ix}$ in any feasible solution of the MILP are restricted to be either 0 or 1, and decide the assignments of LPs to the sets: if in a solution of the MILP $b_{ix}$=1 for LPi and set x, LPi is to be assigned to set x, 1<=x<=N, where N is the number of sets which all LPs need to be assigned to. The value of $s_{ij}$ depends on $b_{ix}$ and $b_{jx}$ for all possible x. The value of $s_{ij}$ is 1 if and only if LPi and j are assigned to different sets. P is the progression rate to be maximized by the MILP solver. Constraint (2)-(4) ensure that a feasible solution to the MILP gives a balanced partitioning. If the balance requirement is not needed, constraint (3) can be dropped. Constraint (1) is the key to maximizing P, the progression rate. It can be shown that any feasible solution to the MILP, P is indeed the minimum LD ratio across all cycles in G.

In constraint (1) constant $d_{ij}$ is the processing delay of LPi and the delay experienced by an event traveling from LPi to j, if both LPs are assigned to the same set. The constant $\delta_{ij}$ is the additional delay experienced by an event traveling from LPi to j if LPi and j are not in the same set. Therefore the term $(d_{ij}+s_{ij}\delta_{ij})$ in constraint (1) depends on the value of $s_{ij}$, and is the total delay (processing and communication) experienced by an event processed by LPi and travels from LPi to j.

Another type of MILP formulation not directly maximizing P but using a predetermined value of P as a constraint can also be used. Such a formulation has a different objective function, which can be the minimization of the sum of the weighted cost of links connecting LPs in different sets. The following formulation embodies such a method:

$$\text{Objective: minimize} \sum_{(i,j) \in G} (C_{ij} \times s_{ij}) \quad (1)$$

Subject to:

$$\forall (i, j) \in G, a_i - a_j + (d_{ij} + s_{ij}\delta_{ij}) \le L_{ij} \times \frac{1}{P'} \quad (1)$$

$$\forall LPi, \sum_{x=1}^{N} b_{ix} = 1 \quad (2)$$

$$\forall x, 1 \le x \le N, \sum_{LPi} b_{ix} \le M \quad (3)$$

$$\forall x, 1 \le x \le N, s_{ij} \ge b_{ix} - b_{jx} \quad (4)$$

$$P \ge 0, b_{ix} \in \{0, 1\} \quad (5)$$

The meaning of the variables and constants are similar to the ones in the previous MILP formulation. The differences are that now P' is a given constant, a desired system progression rate to be satisfied. In addition, a new set of constants $C_{ij}$ appears in the objective function. These constants represent a different notion of LP link cost other than the ones depending on $L_{ij}$ and $d_{ij}$, like the communication volume to be minimized between the computing devices executing the LPs. Other formulations are also possible. For example, let X be a non-empty subset of all cycles in G, in both MILPs constraint (1) can be replaced by the following:

$$\forall C \in X, P \le \frac{\sum_{(i,j) \in C} L_{ij}}{\sum_{(i,j) \in C} (d_{ij} + s_{ij}\delta_{ij})}$$

for the first MILP, and $$\forall C \in X, P' \le \frac{\sum_{(i,j) \in C} L_{ij}}{\sum_{(i,j) \in C} (d_{ij} + s_{ij}\delta_{ij})}$$

for the second MILP.

Whether a given system progression rate P' is satisfied by a found partitioning can be decided by various approaches. These approaches are discussed below:

1. Assign each LP link with proper Lij and du values. Enumerate all of the cycles and compute LD ratios for respective cycles. The minimum LD ratio is the system progression rate to be checked against P'.
2. Assign each LP link with proper Lij and dij values. Use Lij as the "profit" and "dij" as the "cost" of link (i, j), compute the minimum LD ratio using the minimum cycle ratio algorithm, which is the system progression given the partitioning, and compare it against P'.
3. Assign each LP link from LPi to j a new weight $$L_{ij} \times \frac{1}{P'} - (d_{ij} + s_{ij}\delta_{ij}),$$

where $s_{ij}$ is 1 if and only if LPi and j are assigned to two different sets. Compute whether there exists a cycle whose total weight is negative. If there is such a cycle, progression rate P' is NOT satisfied. Otherwise P' is satisfied by the partitioning.

4. All of the above three methods have their corresponding linear programming formulations. Either the feasibility or the optimal value of the objective functions of these linear programmings can be used to decide whether P' is satisfied.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. In association with a plurality of logical processes (LPs) provided to carry out a simulation of a specified physical process, a method comprising the steps of:

modeling the LPs as a directed graph G based on their communication relationship, wherein the directed graph G includes a number of LP links;

finding a partitioning solution to an N-way partitioning problem of the directed graph G, wherein N is equal to or greater than 2;

assigning weights for each LP link of the partitioning solution, the weights comprising a lookahead value and transit time, wherein the lookahead value represents an amount of time actually taken to simulate a physical process, and the transit time is for an event on the LP link;

computing a system progression rate for the partitioning, wherein the system progression rate is computed using a specified function of the lookahead values and link transit times determined for all LPs of the partitioning, wherein said specified function comprises:

for each given cycle of the partitioning, dividing a sum of the lookahead values for the given cycle by a sum of the link transit times for the given cycle to provide an LD ratio for the given cycle; and     selecting a lowest LD ratio from amongst the LD ratios for all cycles computed for the partitioning to be the system progression rate for the partitioning;

determining whether the partitioning solution is satisfactory based on prespecified criteria, wherein the prespecified criteria is selected from a group that includes at least a criteria that a system progression rate satisfies a certain predetermined value and the system progression rate is maximized; and responsive to determining that the partitioning solution is not satisfactory based on prespecified criteria, performing steps of:

finding another partitioning solution to the N-way partitioning problem of the directed graph G;

assigning another weights for each another LP link of the another partitioning solution, the another weights comprising another lookahead value and another transit time, wherein the another lookahead value represents an amount of time actually taken to simulate another physical process using the another partitioning solution, and the another transit time is for another event on the another LP link of the another partitioning solution;

computing another system progression rate for the another partitioning, wherein the another system progression rate is computed using a specified function of the lookahead values and link transit times determined for all LPs of the another partitioning, wherein said specified function comprises:

for each given cycle of the another partitioning, dividing a sum of the lookahead values for the given cycle by a sum of the link transit times for the given cycle to provide an LD ratio for the given cycle; and         selecting a lowest LD ratio from amongst the LD ratios for all cycles computed for the another partitioning to be the system progression rate for the another partitioning;

determining whether the another partitioning solution is satisfactory based on the prespecified criteria; and     responsive to determining that the another partitioning solution is satisfactory based on the prespecified criteria, executing, on a plurality of computer devices, the plurality of LPs that are configured in accordance with the another partitioning to simulate the plurality of physical processes.

2. The method of claim 1, wherein the prespecified criteria is the system progression rate satisfies the certain predetermined value, wherein the system progression rate is a measure of how much run time the simulator needs to simulate operation of an entire physical system during a given amount of virtual time.

3. The method of claim 2, wherein the system progression rate is defined as a ratio of the given amount of virtual time to the run time.

\* \* \* \* \*